(12) United States Patent
Qin et al.

(10) Patent No.: US 12,094,913 B2
(45) Date of Patent: Sep. 17, 2024

(54) DISPLAY PANEL AND DISPLAY DEVICE

(71) Applicant: KunShan Go-Visionox Opto-Electronics Co., Ltd, Jiangsu (CN)

(72) Inventors: Xu Qin, Kunshan (CN); Yanqin Song, Kunshan (CN); Weilong Li, Kunshan (CN); Lu Zhang, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 622 days.

(21) Appl. No.: 17/367,942

(22) Filed: Jul. 6, 2021

(65) Prior Publication Data

US 2021/0335853 A1  Oct. 28, 2021

Related U.S. Application Data

(63) Continuation of application No. PCT/CN2019/116728, filed on Nov. 8, 2019.

(30) Foreign Application Priority Data

May 28, 2019  (CN) .......................... 201910449129.3

(51) Int. Cl.
*H01L 27/146* (2006.01)
*G06V 10/10* (2022.01)
(Continued)

(52) U.S. Cl.
CPC ........ *H01L 27/14678* (2013.01); *G06V 10/12* (2022.01); *G06V 10/147* (2022.01);
(Continued)

(58) Field of Classification Search
CPC ...................... H01L 27/14678; H01L 27/1255
See application file for complete search history.

(56) References Cited

U.S. PATENT DOCUMENTS 10,090,415 B1 * 10/2018 Hekmatshoartabari ...................... H01L 21/02532
2002/0180585 A1 * 12/2002 Kim .................. G06V 40/1318 340/5.74

(Continued)

FOREIGN PATENT DOCUMENTS

CN   106897692 A   6/2017
CN   106940488 A   7/2017
(Continued)

OTHER PUBLICATIONS

International Search Report issued on Mar. 4, 2020 in corresponding International Application No. PCT/CN2019/116728; 6 pages.
(Continued)

*Primary Examiner* — Vincent Wall
(74) *Attorney, Agent, or Firm* — Maier & Maier, PLLC

(57) ABSTRACT

A display panel and a display device, a fingerprint identification region of the display panel includes a substrate layer and a pixel circuit; the pixel circuit includes a DTFT unit, a source wiring, a drain wiring, and a capacitor unit arranged on the substrate layer; a source region of the DTFT unit is connected with the source wiring, a drain region of the DTFT unit is connected with the drain wiring, a light-transmitting region is located between a channel region of the DTFT unit and the drain wiring; a projection of the capacitor unit on the substrate layer covers the projection of the channel region on the substrate layer, thereby reducing the diffraction generated by the light-transmitting gap between the channel region and the source wiring, and improving the imaging quality of fingerprint under the screen.

17 Claims, 13 Drawing Sheets

(51) Int. Cl.
    *G06V 10/12*     (2022.01)
    *G06V 10/147*    (2022.01)
    *G06V 40/13*     (2022.01)
    *H01L 25/16*     (2023.01)
    *H01L 27/12*     (2006.01)
    *H01L 27/15*     (2006.01)
    *H10K 59/121*    (2023.01)

(52) U.S. Cl.
    CPC .......... *G06V 10/17* (2022.01); *G06V 40/1318* (2022.01); *H01L 27/124* (2013.01); *H01L 27/1255* (2013.01); *H01L 25/167* (2013.01); *H01L 27/1218* (2013.01); *H01L 27/156* (2013.01); *H10K 59/1216* (2023.02)

(56) References Cited

U.S. PATENT DOCUMENTS

2015/0331453 A1* 11/2015 Kim ................. H04N 1/00
                                                   345/32
2017/0205953 A1*  7/2017 Sun .................. H01L 27/1255
2018/0101259 A1   4/2018 No et al.
2018/0357460 A1  12/2018 Smith et al.

FOREIGN PATENT DOCUMENTS

| CN | 107194321 A    | 9/2017  |
|----|----------------|---------|
| CN | 108538206 A    | 9/2018  |
| CN | 108597374 A    | 9/2018  |
| CN | 108878481 A    | 11/2018 |
| CN | 108922469 A    | 11/2018 |
| CN | 109004012 A    | 12/2018 |
| CN | 109684958 A    | 4/2019  |
| CN | 109697958 A    | 4/2019  |
| CN | 110188744 A    | 8/2019  |
| WO | 2017/074097 A1 | 5/2017  |

OTHER PUBLICATIONS

Office Action issued on Apr. 2, 2020 in corresponding Chinese Application No. 201910449129.3; 9 pages.

* cited by examiner

DISPLAY PANEL AND DISPLAY DEVICE

CROSS-REFERENCE TO RELATED APPLICATIONS

This application is a continuation of International Application No. PCT/CN2019/116728, filed on Nov. 8, 2019, which claims priority to Chinese Patent Application No. 201910449129.3, filed on May 28, 2019. Both of the above applications are hereby incorporated by reference in their entireties.

TECHNICAL FIELD

The present application relates to a field of display technology and, in particular, to a display panel and a display device.

BACKGROUND

With the development of display technology, in order to improve user experience, by reusing a display region of a display panel as a fingerprint identification region, fingerprint identification under the screen can be achieved. When a user performs a fingerprint identification operation on a display device with fingerprint identification under the screen, the user only needs to touch the fingerprint identification region of the display panel with his/her finger, and the display device can detect the user's fingerprint information.

The way for achieving fingerprint identification under the screen of the display panel in the related technology is usually to embed a fingerprint identification unit in a substrate of the display panel. During a process of fingerprint identification, the user's finger touches a surface of the display panel, light emitted by a pixel unit shines on the user's finger, and the light is reflected by the user's finger and then shines on the fingerprint identification unit through a pixel layer of the display panel, the fingerprint identification unit determines valleys and ridges of the fingerprint of the user's finger according to an intensity distribution of the received light, so as to achieve the fingerprint identification.

However, with the continuous improvement of display requirements, the pixel density (Pixels Per Inch, referred to as PPI) and pixel circuit density of a display panel are larger, the light reflected to the fingerprint identification unit is blocked during the fingerprint recognition, so the overall imaging quality of the fingerprint under the screen is not high.

A display panel includes a display region and a non-display region surrounding the display region, the non-display region is configured for fixing and installing the display panel, and the display region is a main functional region. In order to improve the display effect of full screen and reduce an area of the non-display region, a fingerprint identification solution under the screen reuses at least a part of the display region as a fingerprint identification region. Referring to FIG. 1, it is a schematic cross-section view of a pixel circuit 100 of a fingerprint identification region of a display panel. The display panel usually includes a substrate layer 101, a low temperature polysilicon (PSI) layer 102, a first insulating layer 103, a first metal layer 104, a capacitor insulating layer 105, a second metal layer 106, a second insulating layer 107, a third metal layer 108, a protective layer 109, an anode 110, a pixel defining layer 111, and a pixel layer (not shown) arranged on the anode 110 to form a light emitting component together with the anode 110, as shown in FIG. 1. In that case, the PSI layer 102 forms a drive thin film transistor (referred as DTFT) with the first insulating layer 103 and the first metal layer 104, and the PSI layer 102 is also overlaid with the first metal layer 104 insulatively to form a Thin Film Transistor (referred as TFT). The first metal layer 104, the capacitor insulating layer 105 and the second metal layer 106 also form a storage capacitor of the pixel circuit 100, the capacitor insulating layer 105 is usually a silicon nitride layer. The second insulating layer 107 is overlaid on the second metal layer 106, and the second insulating layer 107 usually includes a silicon nitride layer and a silicon oxide layer overlaid in sequence, wherein the silicon nitride layer is arranged at a side of the second metal layer 106 facing away from the substrate layer 101. The first metal layer 104 is patterned to form a gate of the DTFT, scan lines and light emitting control signal lines. The second metal layer 106 can be patterned to form a reference signal line of the pixel circuit 100 and an upper electrode plate of the storage capacitor. The upper electrode plate and the gate formed by the first metal layer 104 are overlaid insulatively to form the storage capacitor, and the gate formed by the first metal layer 104 is a lower electrode plate of the storage capacitor. The third metal layer 108 is patterned to form a plurality of data lines and a plurality of power lines, and the data lines and the power lines are served as a plurality of bridges between different circuit units in the structure of the pixel circuit 100 at the same time. In a structure shown in FIG. 1, a fingerprint image detection unit 112 can usually be arranged under the transparent substrate layer 101, that is, fingerprint image detection unit 112 is arranged at a side of the substrate layer 101 facing away from the PSI layer 102; the fingerprint image detection unit 112 is usually much larger than the pixel circuit in size, and the size in the figure is only for illustration, which does not constitute a limitation to the embodiments of the present application.

When the display panel is used for fingerprint identification, a user's finger touches a surface of the display panel to light up the display panel, so that light emitted by light emitting components in the display panel is reflected by the surface of the user's finger, and the reflected light passes through the pixel circuit and reach the fingerprint image detection unit. The fingerprint image detection unit obtains an image signal of the user's fingerprint according to a received light. In that case, in the process of the reflected light passes through the pixel circuit and reach the fingerprint image detection unit, the reflected light is blocked by light-proof structures of the pixel circuit and the light emitting components, and with the continuous improvement of PPI of the current display panel, the density of the pixel circuits in the display region is continuously increasing; the shielding of the reflected light caused by the light-proof structures is more serious, and less reflected light is finally shined on the fingerprint image detection unit, and an overall imaging quality of the fingerprint under the screen is low.

SUMMARY

The present application provides a display panel and a display device, which improves area and light transmittance of a single light-transmitting region, thereby improving the overall imaging quality of the fingerprint under the screen.

The present application provides a display panel including a fingerprint identification region; the fingerprint identification region includes a substrate layer and a pixel circuit; the pixel circuit includes a drive thin film transistor (DTFT) unit, a source wiring, a drain wiring, and a capacitor unit arranged on the substrate layer; a source region of the DTFT unit is connected with the source wiring, a drain region of the DTFT unit is connected with the drain wiring; a light-transmitting region is located between a channel region of the DTFT unit and the drain wiring; where a projection of the channel region of the DTFT unit on the substrate layer is located between a projection of the source wiring on the substrate layer and a projection of the drain wiring on the substrate layer, and a distance between the projection of the channel region of the DTFT unit and the projection of the source wiring is less than a distance between the projection of the channel region of the DTFT unit and the projection of the drain wiring; a projection of the capacitor unit on the substrate layer covers the projection of the channel region of the DTFT unit on the substrate layer.

The present application provides a display device, including: a fingerprint image detection unit and the display panel according to a first aspect of the application or any one of the various alternatives of the first aspect; the substrate layer is a transparent dielectric layer, the fingerprint image detection unit is arranged at a side of the substrate layer facing away from the pixel circuit.

The present application provides a display panel and a display device, a fingerprint identification region of the display panel includes a substrate layer and a pixel circuit; the pixel circuit includes a drive thin film transistor (DTFT) unit, a source wiring, a drain wiring, and a capacitor unit arranged on the substrate layer; a source region of the DTFT unit is connected with the source wiring, a drain region of the DTFT unit is connected with the drain wiring, a light-transmitting region is located between a channel region of the DTFT unit and the drain wiring; where a projection of the channel region of the DTFT unit on the substrate layer is close to a projection of the source wiring on the substrate layer, so as to reduce a width of a light-transmitting gap between the channel region of the DTFT unit and the source wiring, and increase a distance between the channel region of the DTFT unit and the drain wiring, thereby increasing a light-transmitting area of a single light-transmitting region; furthermore, a projection of the capacitor unit on the substrate layer covers the projection of the channel region of the DTFT unit on the substrate layer, thereby reducing diffraction generated by the light-transmitting gap between the channel region of the DTFT unit and the source wiring, and improving the imaging quality of the fingerprint under the screen.

DETAILED DESCRIPTION OF THE EMBODIMENTS

Figure 1:
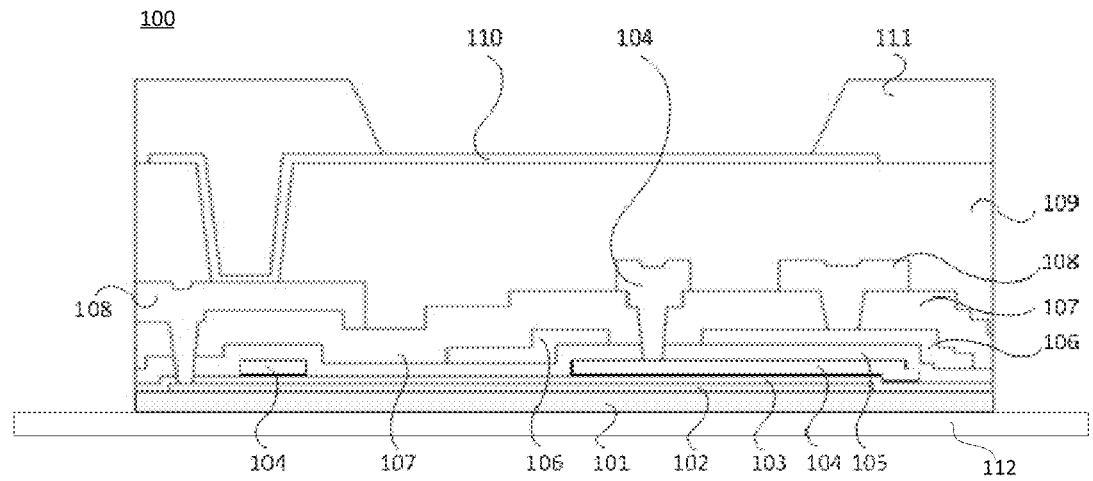
FIG. 1 is a schematic cross-section view of a pixel circuit of a fingerprint identification region of a display panel.

In order to make the purpose, technical solutions and advantages of the embodiments of the present application more explicit, the technical solutions in the embodiments of the present application will be described clearly and completely below with reference to the accompanying drawings in the embodiments of the present application. Obviously, the described embodiments are only some embodiments of the present application, not all of them. Based on the embodiments of the present application, all other embodiments obtained by those of ordinary skill in the art without creative works shall fall within the protection scope of the present application.

The technical solutions of the present application will be described in detail below with specific embodiments. Examples of the embodiments are shown in the drawings, in which the same or similar reference numbers are used throughout to represent the same or similar components or components with the same or similar functions. The following specific embodiments can be combined with each other, and the same or similar concepts or processes may not be repeated in some embodiments.

The connection relationship among structures in the display panel in the following embodiments of the present application is similar to the structure shown in FIG. 1, however, through the design of the relative positions among the structures, the imaging quality of the fingerprint under the screen of the display panel is improved. For the structure having no electrical connection relationship in the related art shown in FIG. 1, there is no electrical connection relationship in the following embodiments of the present application, terms "cover" and "overlaid" in the following embodiments simply refer to the relative position relationship between two structures, rather than limiting the connection relationship therebetween.

In order to solve the above problems in current display panel, an embodiment of the present application provides a display panel, by arranging the light-proof structures in the pixel circuit, the number of light-transmitting regions having a small area is reduced, a light-transmitting area of a single light-transmitting region is increased, the interference caused by diffraction is reduced, thereby improving the overall imaging quality of the fingerprint under the screen.

Figure 2A:
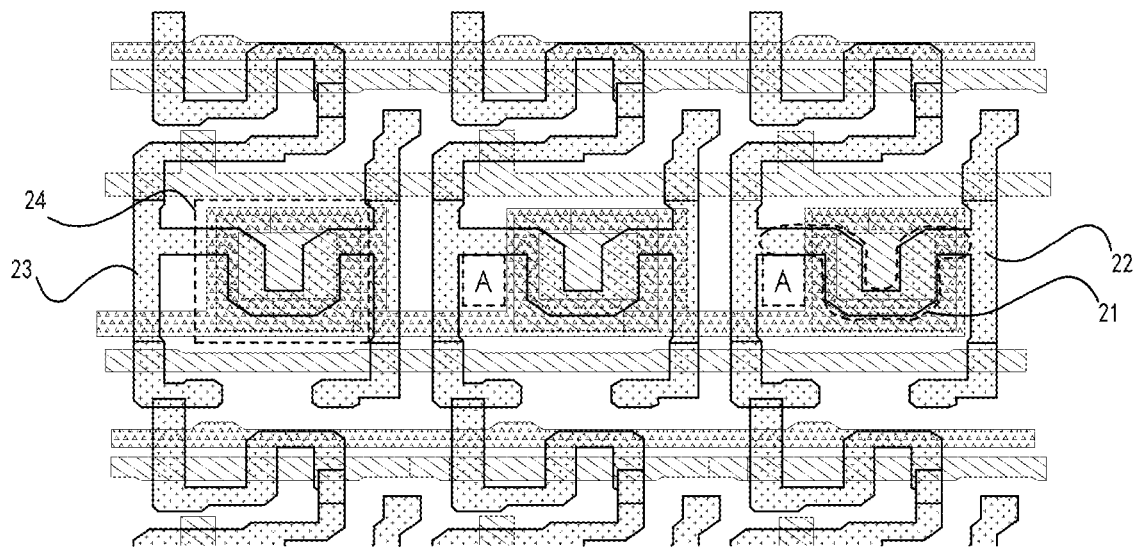
FIG. 2A is a partial top view of a display panel provided by an embodiment of the present application.
Figure 2B:
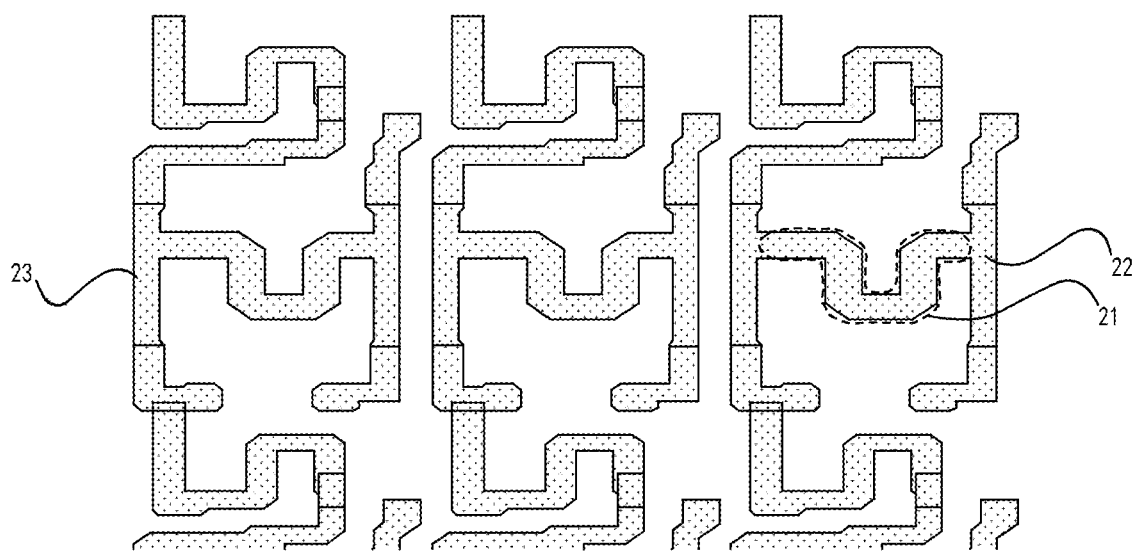
FIG. 2B is a partial top view of a layer filled with crosses in FIG. 2A.
Figure 2C:
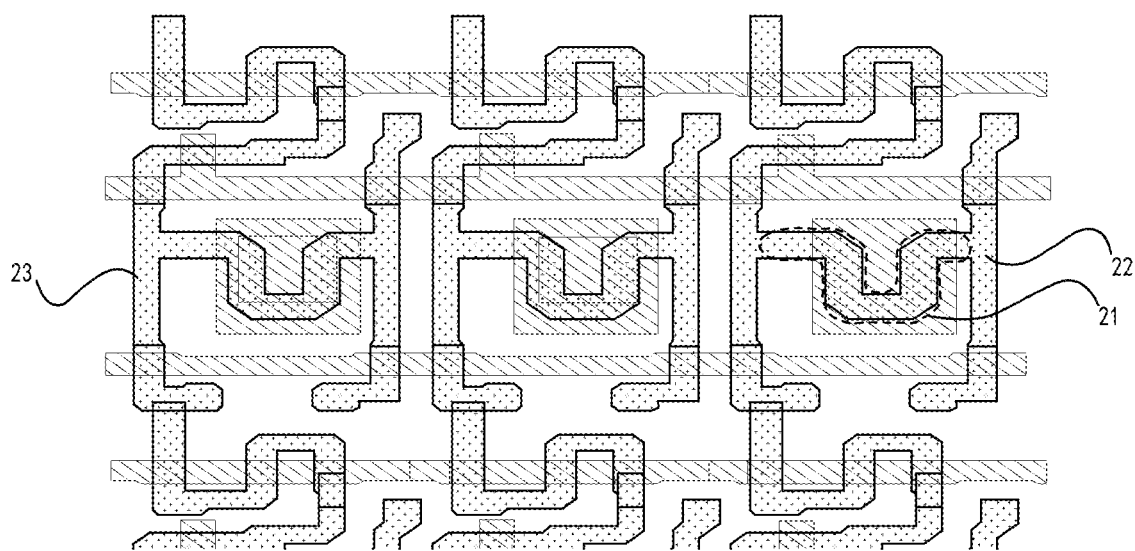
FIG. 2C is a partial top view of the layer filled with crosses and a layer filled with oblique lines in FIG. 2A.
Figure 2D:
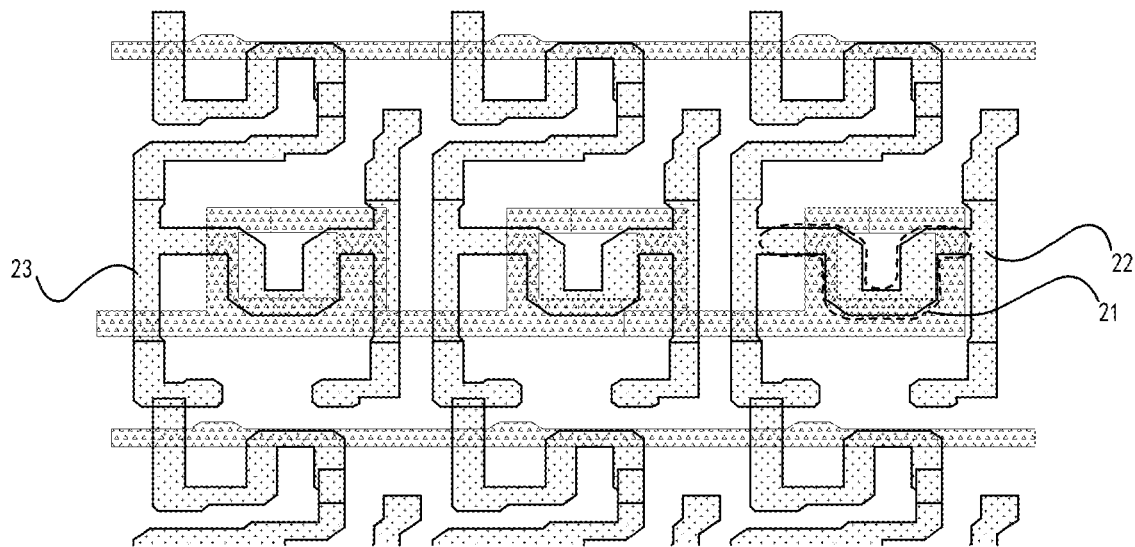
FIG. 2D is a partial top view of the layer filled with crosses and a layer filled with triangles in FIG. 2A.

The display panel provided by the embodiment of the present application includes a fingerprint identification region, referring to FIG. 2A, it is a partial top view of the display panel provided by the embodiment of the present application. FIG. 2A shows 3 pixel circuits arranged in a row direction in the display panel, structures having the same filling pattern are structures obtained by patterning the same layer (for example, all the structures filled with oblique lines are obtained by patterning the first metal layer). In the fingerprint identification region of the display panel, a substrate layer and a layer of a pixel circuit are provided, while the substrate layer is usually a transparent silicon oxide layer and/or a silicon nitride layer, in other words, a silicon oxide layer or a silicon nitride layer is used as the single layer of substrate, a silicon oxide layer and a silicon nitride layer can also be used as a double layer of substrate. Structures which block the reflected light of the user's fingerprint are mainly non-transparent pixel circuit structures, the following drawings of the embodiments mainly illustrate the non-transparent structure; furthermore, in order to simplify the schematic diagrams, data lines extending in a column direction are not shown in the drawings. The fingerprint identification region mainly includes the substrate layer and the pixel circuit, FIG. 2A is a schematic figure of the display panel having the non-transparent structures of the pixel circuit of the fingerprint identification region.

In a structure shown in FIG. 2A, the pixel circuit includes a drive thin film transistor (DTFT) unit 21, a source wiring 22, a drain wiring 23, and a capacitor unit 24 arranged on the substrate layer.

In that case, a source region of the DTFT unit 21 (represented by a U-shaped frame with dotted lines in FIG. 2A) is connected with the source wiring 22, a drain region of the DTFT unit 21 is connected with the drain wiring 23; a light-transmitting region A is located between a channel region of the DTFT unit 21 and the drain wiring 23.

Referring to FIG. 2A, the DTFT unit 21, the source wiring 22 and the drain wiring 23 are arranged in the PSI layer. A patterned part of the DTFT unit 21 on the PSI layer can be seen in an approximate U-shaped portion sandwiched between the source wiring 22 and the drain wiring 23 in FIG. 2A. In FIG. 2A, a U-shaped zone of the approximate U-shaped portion is the channel region of the DTFT unit 21, the source wiring 22 located at a left side of the DTFT unit 21 is connected with the source region of the DTFT unit 21, the drain wiring 23 located at a right side of the DTFT unit 21 is connected with the drain region of the DTFT unit 21.

In a current display panel structure, the channel region of the DTFT unit 21 is arranged between the source wiring 22 and the drain wiring 23, a distance between the channel region of the DTFT unit 21 and the source wiring 22 is the same as a distance between the channel region of the DTFT unit 21 and the drain wiring 23, as a result, there may be light-transmitting regions on both sides of the channel region of the DTFT unit 21, that is to say, there may be a light-transmitting region between the channel region of the DTFT unit 21 and the drain wiring 23, and there may be a light-transmitting gap between the channel region of the DTFT unit 21 and the source wiring 22. For improving the overall imaging quality, in the present embodiment, the channel region of the DTFT unit 21 is moved to the source wiring 22, so that the distance between the channel region of the DTFT unit 21 and the source wiring 22 is less than the distance between the channel region of the DTFT unit 21 and the drain wiring 23, thereby increasing the area of the light-transmitting region A between the channel region of the DTFT unit 21 and the drain wiring 23. The present embodiment improves the overall imaging quality by increasing the light-transmitting area of the single light-transmitting region A.

Continuing to refer to FIG. 2A, in that case, a projection of the channel region of the DTFT unit 21 on the substrate layer is located between a projection of the source wiring 22 on the substrate layer and a projection of the drain wiring 23 on the substrate layer, and a distance between the projection of the channel region of the DTFT unit 21 and the projection of the source wiring 22 is less than a distance between the projection of the channel region of the DTFT unit 21 and the projection of the drain wiring 23. The distance between the projection of the channel region of the DTFT unit 21 and the projection of the drain wiring 23 is the width of the light-transmitting region A in a row direction. On this basis, the capacitor unit 24 (represented by a square frame with dotted lines in FIG. 2A) in the present embodiment further covers the channel region of the DTFT unit 21, a projection of the capacitor unit 24 on the substrate layer covers the projection of the channel region of the DTFT unit 21 on the substrate layer. The light transmittance of the display panel can be improved by increasing overlapped area among light-proof structures of different layers.

The present embodiment provides a display panel, a fingerprint identification region of the display panel includes a substrate layer and a pixel circuit; the pixel circuit includes a drive thin film transistor (DTFT) unit, a source wiring, a drain wiring, and a capacitor unit arranged on the substrate layer; a source region of the DTFT unit is connected with the source wiring, a drain region of the DTFT unit is connected with the drain wiring; a light-transmitting region A is located between a channel region of the DTFT unit and the drain wiring; a projection of the channel region of the DTFT unit on the substrate layer is close to a projection of the source wiring on the substrate layer, so as to reduce a width of a light-transmitting gap between the channel region of the DTFT unit and the source wiring, and increase a distance between the channel region of the DTFT unit and the drain wiring, thereby increasing a light-transmitting area of the single light-transmitting region A; furthermore, a projection of the capacitor unit on the substrate layer covers the projection of the channel region of the DTFT unit on the substrate layer, thereby reducing the diffraction generated by the light-transmitting gap between the channel region of the DTFT unit and the source wiring, and improving the imaging quality of the fingerprint under the screen.

On the basis of the above embodiment, continuing to refer to FIG. 2A, in order to prevent the diffraction generated by the light-transmitting gap from affecting the imaging quality, the projection of the capacitor unit on the substrate layer can further cover a gap between the projection of the channel region of the DTFT unit and the projection of the source wiring on the substrate layer. Specifically, the width of the gap is determined by the manufacturing process, for example, the minimum width of the gap is assumed to reach 2 mm. If the distance between the channel region of the DTFT unit and the source wiring and the distance between the channel region of the DTFT unit and the drain wiring are 4 mm respectively, in order to increase the width of the light-transmitting region A in a row direction, the channel region of the DTFT unit is moved 2 mm towards the source wiring. After moving, the width of the light-transmitting region A in the row direction reaches 6 mm, which can achieve a greater light transmission, and the width of the gap between the channel region of the DTFT unit and the source wiring is 2 mm, diffraction generated by the gap between the channel region of the DTFT unit and the source wiring will affect the imaging quality.

For avoiding a problem of diffraction generated by the light-transmitting gap between the channel region of the DTFT unit and the source wiring, in the present embodiment, the capacitor unit which covers the channel region of the DTFT unit is moved towards the source wiring, until the projection of the capacitor unit on the substrate layer covers the gap between the projection of the channel region of the DTFT unit and the projection of the source wiring on the substrate layer, thereby reducing diffraction interference caused by the light-transmitting gap, and improving the overall imaging quality of the display panel. In some specific implementations, the capacitor unit includes an upper electrode plate (see a part filled with triangles in a square frame with dotted lines shown in FIG. 2A) and a lower electrode plate (see a part filled with oblique lines in a square frame with dotted lines shown in FIG. 2A) which are overlaid insulatively. A projection of the upper electrode plate on the substrate layer can cover a projection of the lower electrode plate on the substrate layer, and the projection of the upper electrode plate on the substrate layer can also cover the gap between the projection of the channel region of the DTFT unit and the projection of the source wiring on the substrate layer; while the projection of the lower electrode plate on the substrate layer can cover the projection of the channel region of the DTFT unit on the substrate layer. For example, in order to save space, the lower electrode plate forms a common gate of the DTFT unit, so the lower electrode plate cannot cover the light-transmitting gap between the channel region of the DTFT unit and the source wiring. However, by extending the upper electrode plate in a row direction, the light-transmitting gap between the channel region of the DTFT unit and the source wiring can be covered by the upper electrode plate, in other words, the projection of the upper electrode plate on the substrate layer covers the gap between the projection of the channel region of the DTFT unit and the projection of the source wiring on the substrate layer, so as to prevent reflected light of a user's fingerprint from diffracting in the light-transmitting gap between the channel region of the DTFT unit and the source wiring, thereby improving the overall imaging quality of the display panel.

Figure 3A:
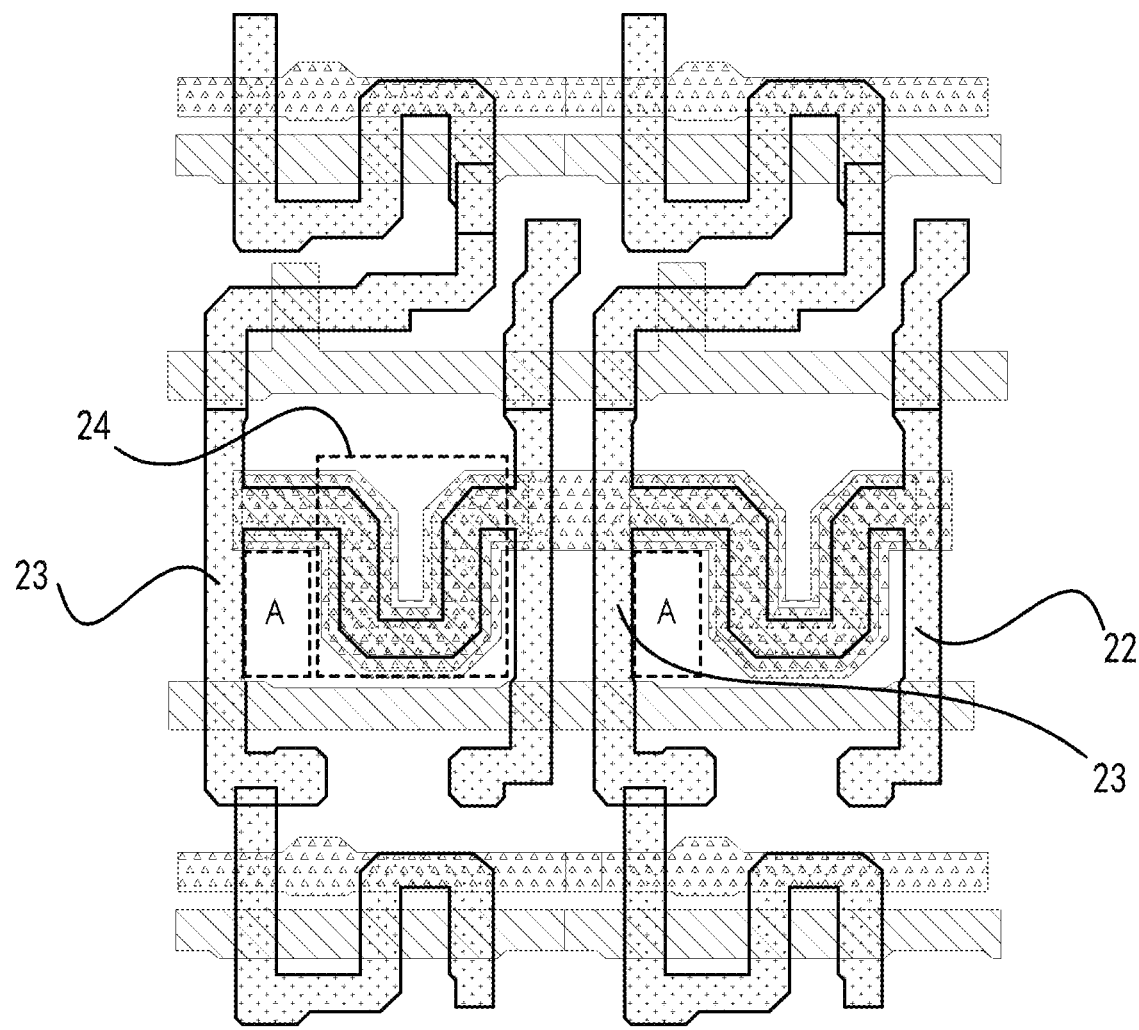
FIG. 3A is a partial top view of a display panel having a capacitor unit and a DTFT unit, where a projection of the capacitor unit on a substrate layer and a projection of a DTFT unit on the substrate layer have the same shape.
Figure 3B:
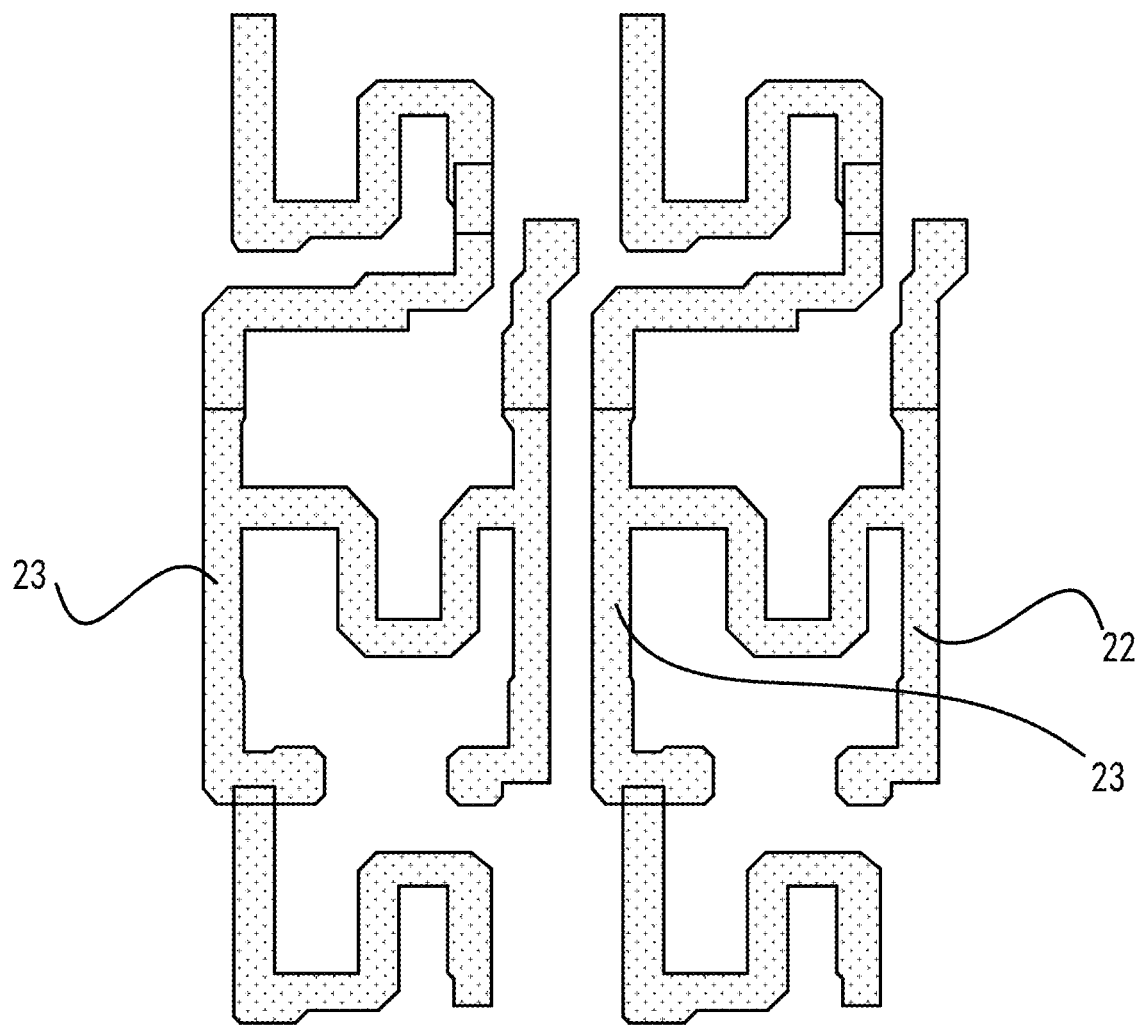
FIG. 3B is a partial top view of a layer filled with crosses in FIG. 3A.
Figure 3C:
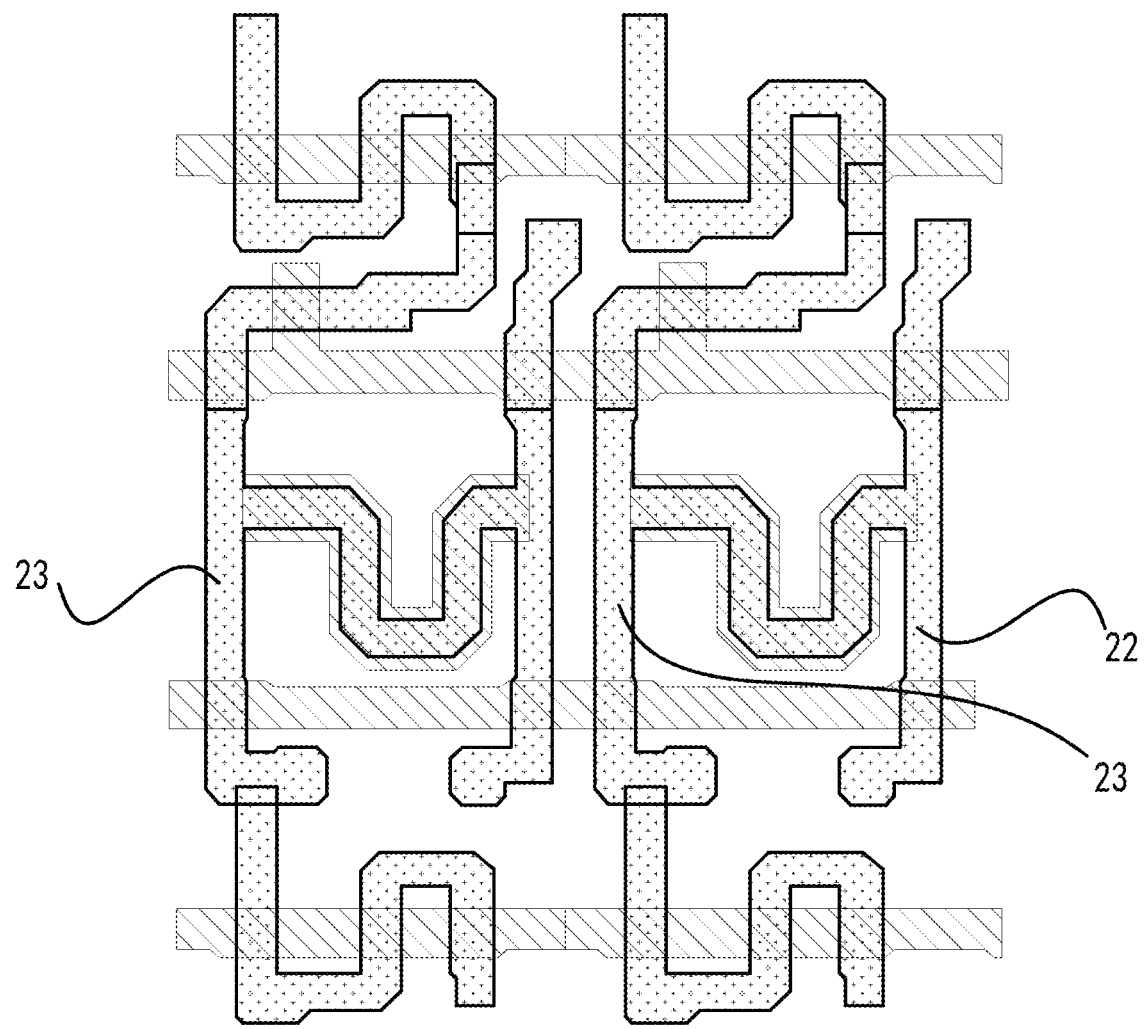
FIG. 3C is a partial top view of the layer filled with crosses and a layer filled with oblique lines in FIG. 3A.
Figure 3D:
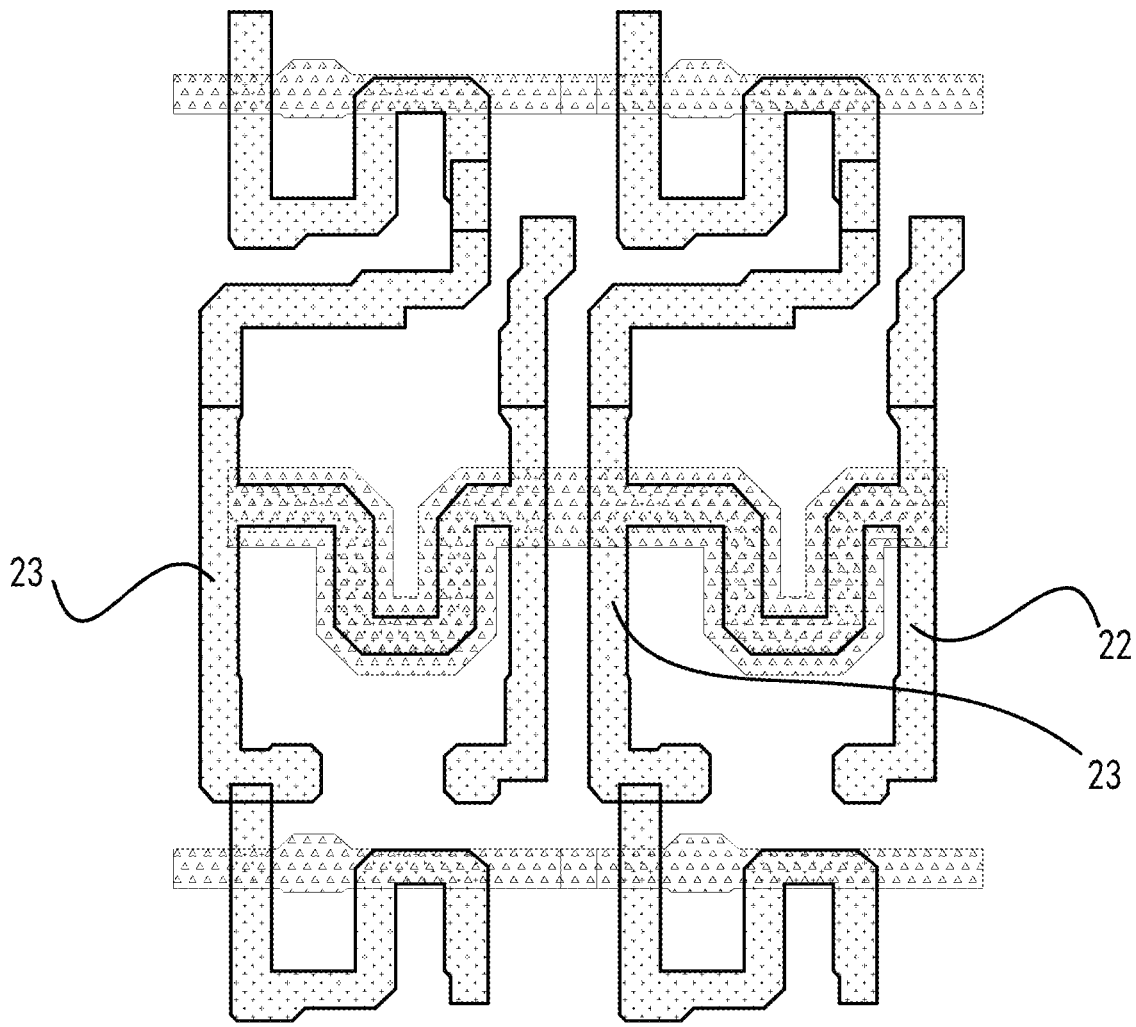
FIG. 3D is a partial top view of the layer filled with crosses and a layer filled with triangles in FIG. 3A.

The capacitor unit in the above embodiment is a structure with large light-proof area, in order to improve light transmittance, the shape of the capacitor unit 24 can also be designed; the shape of the capacitor unit 24 can be implemented in a plurality of forms, for example, referring to FIG. 3A, the projection of the capacitor unit 24 on the substrate layer and the projection of the channel region of the DTFT unit on the substrate layer have the same shape. The projection of the capacitor unit 24 on the substrate layer coincides with the projection of the channel region of the DTFT unit on the substrate layer, or, the projection of the channel region of the DTFT unit on the substrate layer is within the projection of the capacitor unit 24 on the substrate layer. After reducing the area of the capacitor unit 24, the capacitance can be increased by reducing the thickness of a capacitor electrode plate of the capacitor unit 24 and/or changing an insulating medium between the two electrode plates of the capacitor unit 24, where specific implementation manners are not limited herein. Referring to FIG. 3A, in this embodiment, the shape of the projection of the capacitor unit 24 on the substrate layer is the same as the shape of the projection of the DTFT unit on the substrate layer, so as to increase the overlapped area among light-proof structures of different layers, at the same time, this can reduce a proportion of the overall light-proof area, thereby improving the light transmittance of the display panel.

Figure 4A:
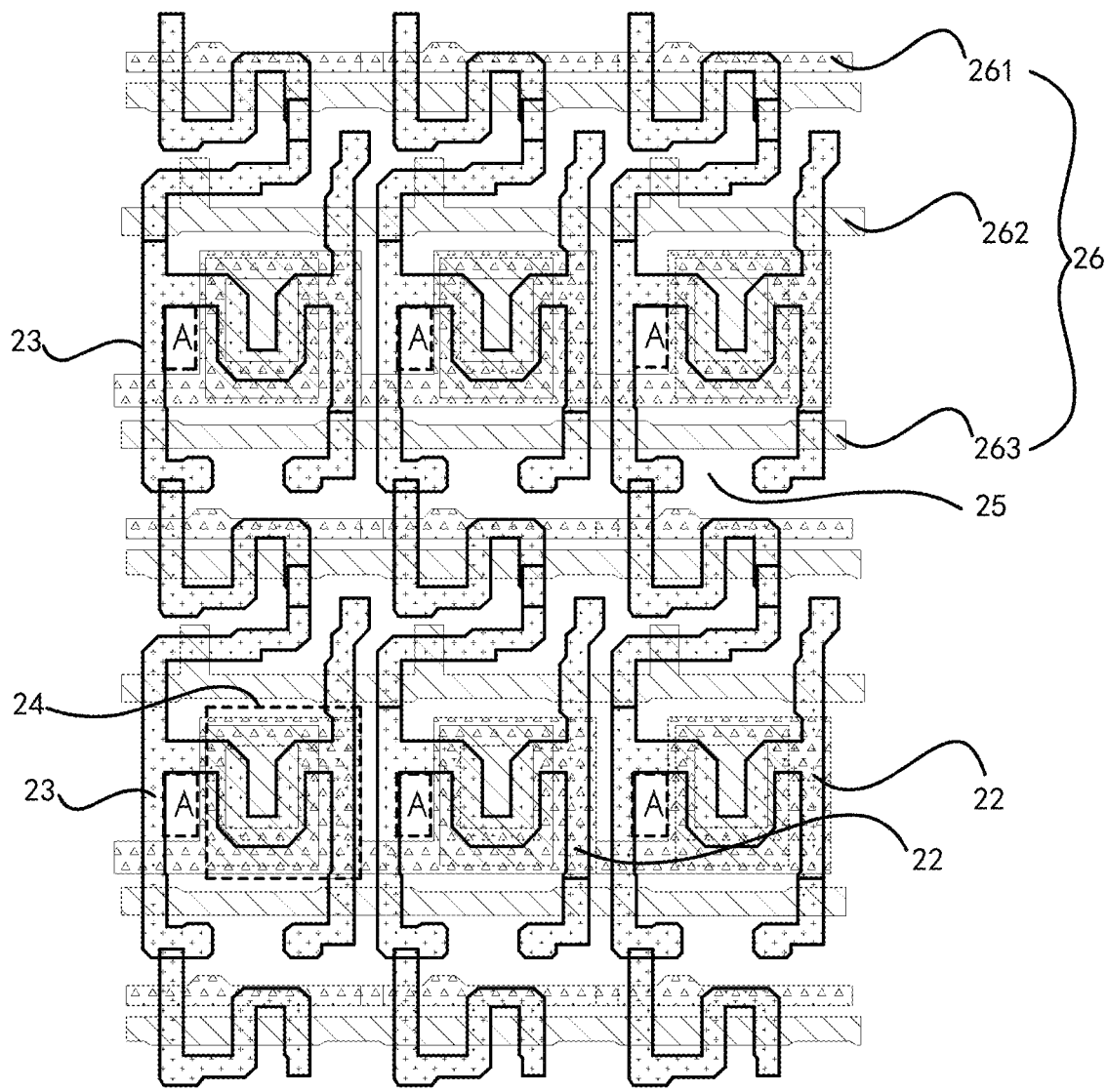
FIG. 4A is a partial top view of a display panel provided by an embodiment of the present application, where an upper electrode plate of a capacitor unit covers at least a part of a source wiring.
Figure 4B:
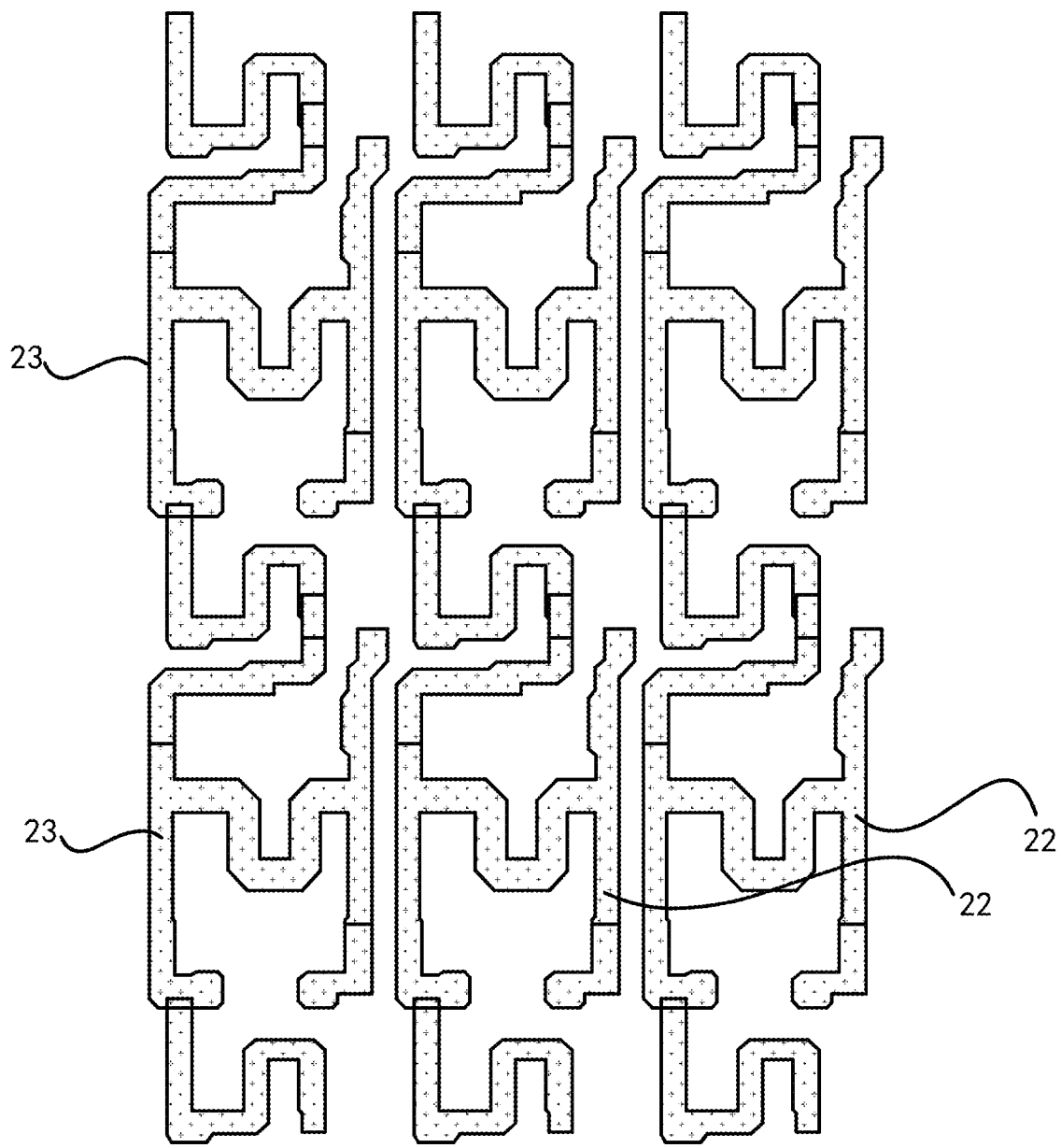
FIG. 4B is a partial top view of a layer filled with crosses in FIG. 4A.
Figure 4C:
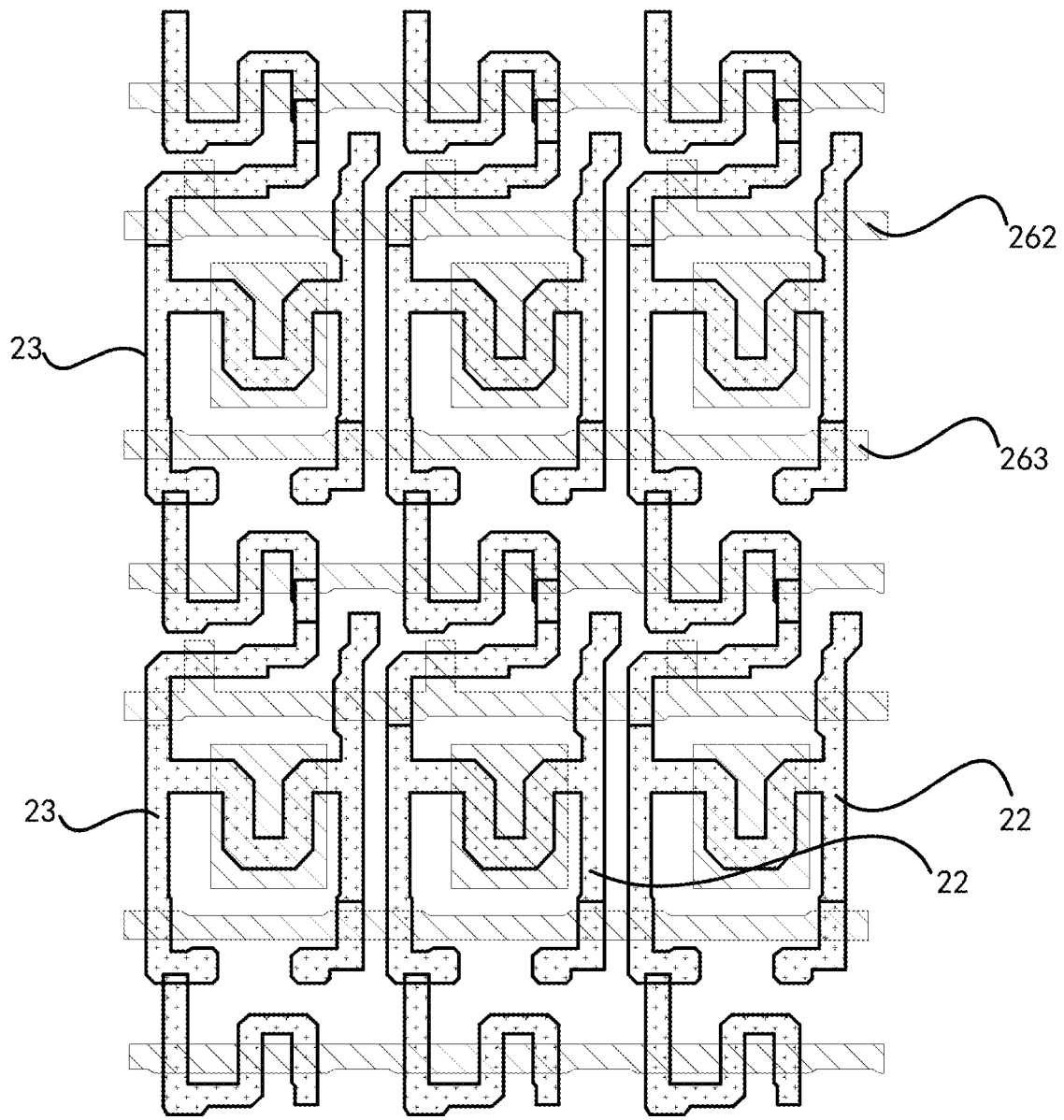
FIG. 4C is a partial top view of the layer filled with crosses and a layer filled with oblique lines in FIG. 4A.
Figure 4D:
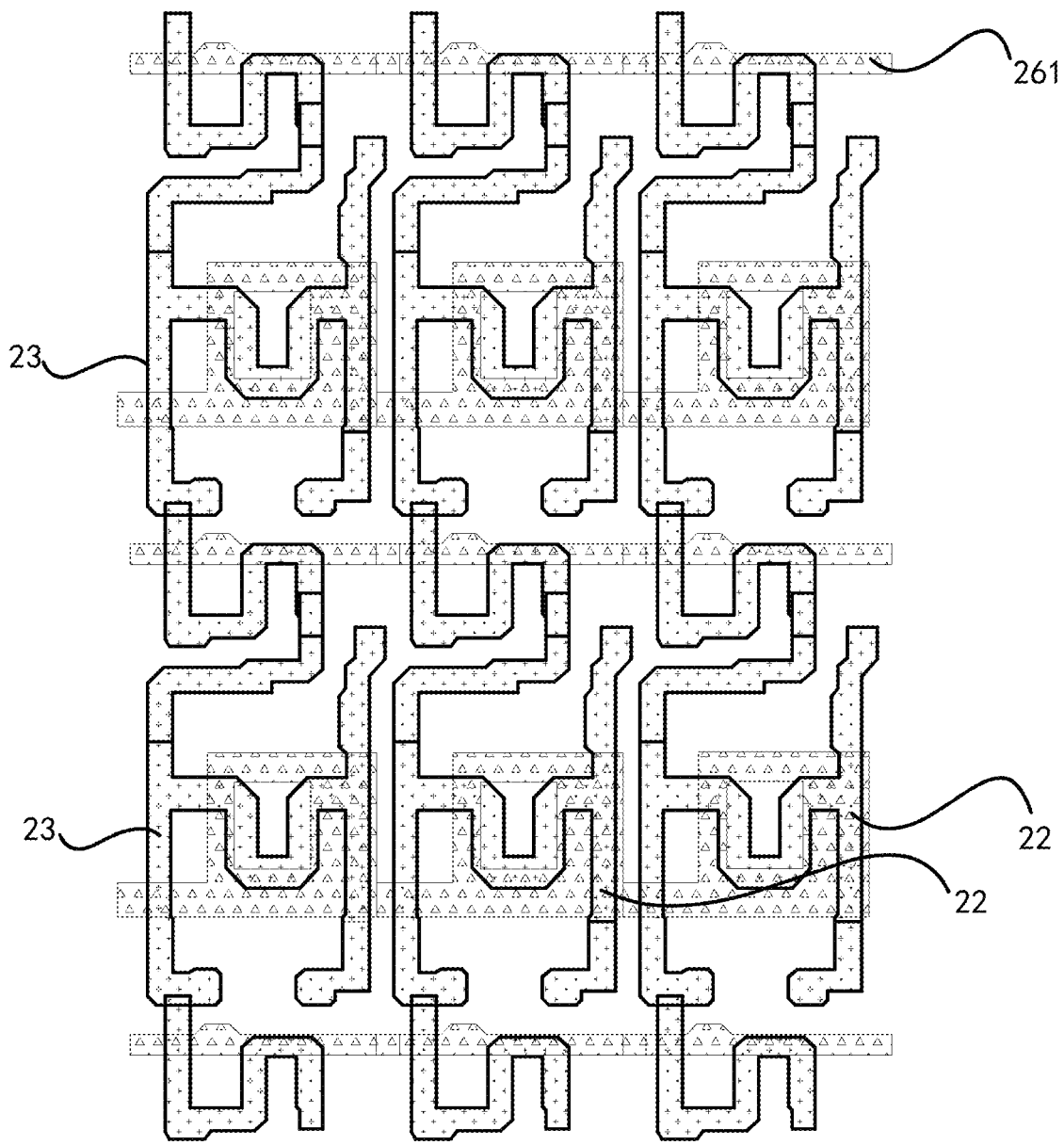
FIG. 4D is a partial top view of the layer filled with crosses and a layer filled with triangles in FIG. 4A.

On the basis of the above embodiment, referring to FIG. 4A, the upper electrode plate of the capacitor unit covers at least part of the source wiring. In the display panel shown in FIG. 4A, the projection of the upper electrode plate of the capacitor unit on the substrate layer is further overlapped with the projection of the source wiring on the substrate layer. An edge of the upper electrode plate of the capacitor unit 24 in a row direction covers at least part of the source wiring. Or, as shown in FIG. 4A, the projection of a section of the source wiring on the substrate layer is within the projection of the upper electrode plate on the substrate layer. In the present embodiment, the upper electrode plate of the capacitor unit covers at least part of the source wiring, which not only increases the overlapped area between the light-proof source wiring and the capacitor unit, but also can shield parasitic capacitance in the source wiring, thereby stabilizing the voltage difference between the gate and the source of the DTFT unit, and reducing the influence of hysteresis.

Figure 5:
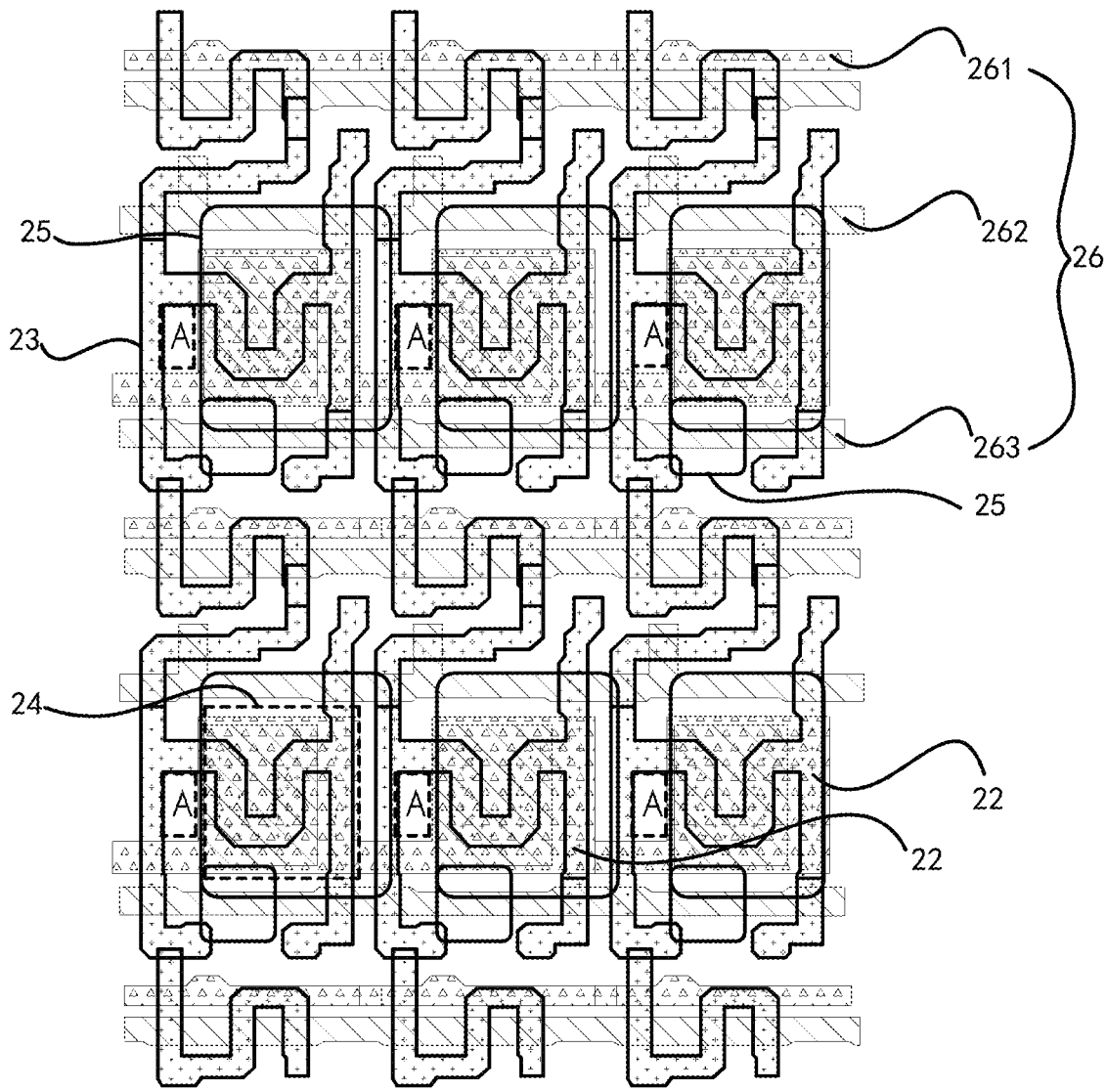
FIG. 5 is a partial top view of a display panel provided by an embodiment of the present application, where a projection of a light emitting component on a substrate layer covers a projection of a capacitor unit on the substrate layer.

In the above embodiment, referring to FIG. 5, there is a partial top view of another display panel provided by an embodiment of the present application. As shown in FIG. 5, in some embodiments, the fingerprint identification region further includes a plurality of light emitting components 25. The light emitting component is arranged at a side of the pixel circuit facing away from the substrate layer (i.e., arranged on a pixel capacitor) and connected with the pixel circuit. In any one of the embodiments shown in FIG. 2A to FIG. 4A, the light emitting component can be designed and arranged according to the light-transmitting region A and a non-light-transmitting region (a region other than the light-transmitting region) reserved in the pixel circuit. For example, referring to FIG. 5, a projection of the light emitting component 25 on the substrate layer covers the projection of the capacitor unit 24 on the substrate layer. Both the capacitor unit 24 and the light emitting component 25 are structures with large light-proof area, therefore, by arranging the capacitor unit 24 and the light emitting component 25 to share the same non-light-transmitting region, the overlapped area of the light-proof structures of different layers is increased, the area utilization rate of the display panel can be increased, thereby improving the light transmittance of the display panel.

Continuing to refer to FIG. 5, the fingerprint identification region further includes: row signal lines 26 extending in a row direction. The row signal lines at least include a reference signal line 261 for increasing a reference voltage (REFN voltage) and a scanning signal line 262 for providing a scanning signal. However, in some embodiments, referring to FIG. 5, the row signal lines further include a light emitting control signal line 263 for providing a light emitting control signal, in other words, there are three row signal lines 26 included in an embodiment shown in FIG. 5. The capacitor unit 24 is usually arranged in a region between two row signal lines 26, for example, the capacitor unit 24 in FIG. 5 is arranged between the scanning signal line 262 and the light emitting control signal line 263. In the present embodiment, the pixel circuit for each of the light emitting components 25 is connected with two row signal lines 26; projections of the two row signal lines 26 corresponding to the light emitting component 25 on the substrate layer are overlapped with the projection of the light emitting component 25 on the substrate layer. Referring to FIG. 5, an upper edge of the light emitting component 25 covers the scanning signal line 262, and a lower edge of the light emitting component 25 covers the light emitting control signal line 263, thus, the relative position between the row signal lines 26 and the light emitting component 25 is determined. In the present embodiment, the projections of the light emitting components 25 are overlapped with projections of row signal lines, so as to reduce a light-transmitting gap between the light emitting component 25 and the row signal lines 26, and further reduce diffraction generated by the light-transmitting gap, thereby improving the overall imaging quality of the display panel.

In the embodiment shown in FIG. 5, the light emitting component 25 can specifically include an anode, a light emitting layer and a cathode overlaid in sequence, where the anode is arranged at the side of the pixel circuit facing away from the substrate layer. The projection of the light emitting component 25 on the substrate layer is a projection of a light-proof dielectric layer having the largest area on the substrate layer. In the related art, the large light-proof area of the anode forms the projection of the light emitting component 25 on the substrate layer. In some embodiments, a projection of the anode on the substrate layer covers projections of the light emitting layer and the cathode on the substrate layer. The anode which is a light-proof dielectric layer can be, for example, a non-transparent indium tin oxide-silver-indium tin oxide composite layer (ITO/Ag/ITO). In the present embodiment, by arranging the position of the anode, the projection position of the light emitting component 25 on the substrate layer is determined.

In some embodiments, the display panel further includes: data lines extending in a column direction. The pixel circuit for each of the light emitting components 25 is connected with one data line. Since the data line is also a light-proof dielectric layer, for improving the light transmittance, in the present embodiment, a projection of the data line on the substrate layer is overlapped with the projection of the light emitting component 25 on the substrate layer. It can be understood that a section of the projection of the data line on the substrate layer is within the projection of the light emitting component 25 on the substrate layer. By overlapping the light-proof surface of the data line with the light-proof surface of the light emitting component 25, the proportion of the light-transmitting area is increased, and the light transmittance of the display panel is improved.

On the basis of the above various embodiments of the display panel, the present application further provides a display device. The display device includes: a fingerprint image detection unit and the display panel according to any one of the above embodiments. In that case, the substrate layer of the display panel is a transparent dielectric layer, the fingerprint image detection unit is arranged at a side of the substrate layer facing away from the pixel circuit. When the fingerprint identification is performed, light emitted by light emitting components shines on a user's finger, and reflected light reflected by the user's finger is shined on the fingerprint image detection unit through a light-transmitting position and the transparent substrate layer of the display panel, where the light-transmitting position includes the light-transmitting region in the above embodiments. The fingerprint image detection unit recognizes valleys and ridges of the fingerprint according to the intensity distribution of the received reflected light. In the embodiments of the present application, the display device utilizes the various possible structures of the display panel as described above, so as to reduce diffraction of the reflected light generated by the light-transmitting gap, and improve the imaging quality of the fingerprint under the screen, thereby increasing the detection accuracy of fingerprint identification.

The display device in the embodiments of the present application includes, but not limited to a cell phone, a personal digital assistant (referred as PDA), a tablet computer, an electronic book, a television, an access control device, a smart landline telephone, a control desk and other devices with display function, and the embodiments of the present application do not limit the form of the display device.

Finally, it should be noted that the above embodiments are only used to illustrate the technical solutions of the present application, without limitation to the above embodiments. Although the present application has been described in detail with reference to the foregoing embodiments, those skilled in the art should understand: modifications to the technical solutions described in the foregoing embodiments, or equivalent substitutions of some or all of the technical features therein can still be made. However, these modifications or substitutions shall not make the essential of corresponding technical solutions depart from the scope of the technical solutions of the embodiments of the present application.

What is claimed is:

1. A display panel, comprising: a fingerprint identification region; the fingerprint identification region comprising a substrate layer and a pixel circuit;
   the pixel circuit comprising a drive thin film transistor unit, a source wiring, a drain wiring, and a capacitor unit arranged on the substrate layer; and
   a source region of the drive thin film transistor unit is connected with the source wiring, a drain region of the drive thin film transistor unit is connected with the drain wiring, a light-transmitting region is located between a channel region of the drive thin film transistor unit and the drain wiring;
   wherein a projection of the channel region of the drive thin film transistor unit on the substrate layer is located between a projection of the source wiring on the substrate layer and a projection of the drain wiring on the substrate layer, and a distance between the projection of the channel region of the drive thin film transistor unit and the projection of the source wiring is less than a distance between the projection of the channel region of the drive thin film transistor unit and the projection of the drain wiring; a projection of the capacitor unit on the substrate layer covers the projection of the channel region of the drive thin film transistor unit on the substrate layer,
   wherein the capacitor unit comprises an upper electrode plate and a lower electrode plate which are overlaid insulatively;
   a projection of the lower electrode plate on the substrate layer covers the projection of the channel region of the drive thin film transistor unit on the substrate layer; and
   a projection of the upper electrode plate on the substrate layer covers the projection of the lower electrode plate on the substrate layer,
   wherein the lower electrode plate forms a common gate of the drive thin film transistor unit.

2. The display panel according to claim 1, wherein the projection of the capacitor unit on the substrate layer further covers a gap between the projection of the channel region of the drive thin film transistor unit and the projection of the source wiring on the substrate layer.

3. The display panel according to claim 1, wherein
   the projection of the upper electrode plate on the substrate layer also covers a gap between the projection of the channel region of the drive thin film transistor unit and the projection of the source wiring on the substrate layer.

4. The display panel according to claim 3, wherein the upper electrode plate extends in a row direction, and the projection of the upper electrode plate covers the gap between the projection of the channel region of the drive thin film transistor unit and the projection of the source wiring on the substrate layer.

5. The display panel according to claim 3, wherein the projection of the upper electrode plate on the substrate layer is further overlapped with the projection of the source wiring on the substrate layer.

6. The display panel according to claim 1, wherein the fingerprint identification region further comprises: a plurality of light emitting components;
   each of the light emitting components is arranged at a side of the pixel circuit facing away from the substrate layer and connected with the pixel circuit; and
   a projection of the light emitting component on the substrate layer covers the projection of the capacitor unit on the substrate layer.

7. The display panel according to claim 6, wherein the fingerprint identification region further comprises: a plurality of row signal lines extending in a row direction; the pixel circuit for each of the light emitting components is connected with two row signal lines;
   wherein projections of the two row signal lines corresponding to the light emitting component on the substrate layer are overlapped with the projection of the light emitting component on the substrate layer.

8. The display panel according to claim 7, wherein the light emitting component comprises an anode, a light emitting layer and a cathode overlaid in sequence;
   the anode is arranged at a side of the pixel circuit facing away from the substrate layer; and a projection of the anode on the substrate layer covers a projection of the light emitting layer and a projection of the cathode on the substrate layer.

9. The display panel according to claim 8, wherein the anode is a light-proof layer, wherein the light-proof layer is a non-transparent indium tin oxide/silver/indium tin oxide composite layer.

10. The display panel according to claim 1, wherein the projection of the capacitor unit on the substrate layer and the projection of the channel region of the drive thin film transistor unit on the substrate layer have a same shape.

11. The display panel according to claim 10, wherein the projection of the capacitor unit on the substrate layer coincides with the projection of the channel region of the drive thin film transistor unit on the substrate layer.

12. The display panel according to claim 10, wherein the projection of the channel region of the drive thin film transistor unit on the substrate layer is within the projection of the capacitor unit on the substrate layer.

13. The display panel according to claim 6, further comprising: a plurality of data lines extending in a column direction; wherein
   the pixel circuit for each of the light emitting components is connected with one data line; a projection of the data line on the substrate layer is overlapped with the projection of the light emitting component on the substrate layer.

14. The display panel according to claim 7, wherein the two row signal lines comprise any two of the following types: a reference signal line for increasing a reference voltage, a scanning signal line for providing a scanning signal, and a light emitting control signal line for providing a light emitting control signal.

15. The display panel according to claim 1, wherein the light-transmitting region is located between the capacitor unit and the drain wiring, the source wiring is a non-transparent structure, the drain wiring is a non-transparent structure, the channel region of the drive thin film transistor unit is a non-transparent structure, and the capacitor unit is a non-transparent structure.

16. A display device, comprising:
   a fingerprint image detection unit and the display panel comprising a fingerprint identification region; the fingerprint identification region comprising a substrate layer and a pixel circuit;
   the pixel circuit comprising a drive thin film transistor unit, a source wiring, a drain wiring, and a capacitor unit arranged on the substrate layer; and
   a source region of the drive thin film transistor unit is connected with the source wiring, a drain region of the drive thin film transistor unit is connected with the drain wiring, a light-transmitting region is located between a channel region of the drive thin film transistor unit and the drain wiring;
   wherein a projection of the channel region of the drive thin film transistor unit on the substrate layer is located between a projection of the source wiring on the substrate layer and a projection of the drain wiring on the substrate layer, and a distance between the projection of the channel region of the drive thin film transistor unit and the projection of the source wiring is less than a distance between the projection of the channel region of the drive thin film transistor unit and the projection of the drain wiring; a projection of the capacitor unit on the substrate layer covers the projection of the channel region of the drive thin film transistor unit on the substrate layer,
   wherein the substrate layer is a transparent dielectric layer, the fingerprint image detection unit is arranged at a side of the substrate layer facing away from the pixel circuit,
   wherein the capacitor unit comprises an upper electrode plate and a lower electrode plate which are overlaid insulatively;
   a projection of the lower electrode plate on the substrate layer covers the projection of the channel region of the drive thin film transistor unit on the substrate layer;
   a projection of the upper electrode plate on the substrate layer covers the projection of the lower electrode plate on the substrate layer, and
   wherein the lower electrode plate forms a common gate of the drive thin film transistor unit.

17. The display device according to claim 16, wherein the substrate layer comprises at least one of a silicon oxide layer and a silicon nitride layer.

* * * * *